United States Patent [19]

Rogler

[11] Patent Number: 5,276,126
[45] Date of Patent: Jan. 4, 1994

[54] SELECTED NOVOLAK RESIN PLANARIZATION LAYER FOR LITHOGRAPHIC APPLICATIONS

[75] Inventor: Robert F. Rogler, Rehoboth, Mass.

[73] Assignee: OCG Microelectronic Materials, Inc., West Paterson, N.J.

[21] Appl. No.: 15,055

[22] Filed: Feb. 8, 1993

Related U.S. Application Data

[63] Continuation of Ser. No. 787,460, Nov. 4, 1991, abandoned.

[51] Int. Cl.$^5$ .................. C08G 8/24; G03C 1/52; B05D 5/12; B29D 22/00
[52] U.S. Cl. .................. 528/155; 528/129; 528/166; 430/166; 430/311; 430/312; 430/313; 430/314; 430/315; 428/35.7; 428/460; 428/620; 428/623; 428/626; 427/96; 427/97; 427/240; 427/385.5
[58] Field of Search .............. 430/166, 311, 312, 313, 430/314, 315; 528/129, 155, 166; 428/35.7, 460, 620, 623, 626

[56] References Cited

U.S. PATENT DOCUMENTS

| 4,123,279 | 10/1978 | Kobayashi | 430/192 |
|---|---|---|---|
| 4,173,473 | 11/1979 | Fahrenholtz et al. | 430/5 |
| 4,308,368 | 12/1981 | Kubo et al. | 430/190 |
| 4,362,809 | 12/1982 | Chen et al. | 430/312 |
| 4,427,713 | 1/1984 | White et al. | 427/54.1 |
| 4,431,565 | 2/1984 | Billenstein et al. | 525/503 |
| 4,515,828 | 5/1985 | Economy et al. | 427/82 |
| 4,532,005 | 7/1985 | Grieco et al. | 156/661.1 |
| 4,612,210 | 9/1986 | Hofer et al. | 427/82 |
| 4,621,042 | 11/1986 | Pampalone et al. | 430/271 |
| 4,642,162 | 2/1987 | Brownell et al. | 156/643 |
| 4,654,113 | 3/1987 | Tuchiya et al. | 156/643 |
| 4,665,007 | 5/1987 | Cservak et al. | 430/311 |
| 4,702,993 | 10/1987 | White et al. | 430/296 |
| 4,732,847 | 3/1988 | Radigan | 430/192 |
| 4,741,926 | 5/1988 | White et al. | 427/240 |
| 4,745,045 | 5/1988 | Fredericks et al. | 430/315 |
| 4,803,147 | 2/1989 | Mueller et al. | 430/288 |
| 4,806,453 | 2/1989 | Vidusek et al. | 430/312 |
| 4,810,617 | 3/1989 | White et al. | 430/190 |

OTHER PUBLICATIONS

D. V. Comello, "Planarizing Lead Edge Devices" Semiconductor International Nov. 1990, pp. 60–62, 64, and 66.

T. R. Pampalone, J. J. DiPiazza, and D. P. Kanen "Novolak Resin Planarization Layers for Multilayer Resist Imaging Systems" Journal of the Electrochemical Society, vol. 133, No. 11, Nov. 1986, pp. 2394–2398.

Primary Examiner—John Kight, III
Assistant Examiner—Richard Lee Jones
Attorney, Agent, or Firm—William A. Simons

[57] ABSTRACT

A method of planarizing topographical features on a substrate for subsequent coating of a radiation sensitive composition thereon comprising:

(1) applying thereover a coating of a planarizing coating layer comprising a planarization layer of novolak resin made by the condensation reaction of an aldehyde source with a phenolic monomeric source comprising at least 25 mole percent of ortho-secondary butyl phenol and a suitable solvent; and (2) heating said coated substrate to remove essentially all of said solvent therefrom and cause said coating to reflow, thereby planarizing the topographical features.

17 Claims, No Drawings

SELECTED NOVOLAK RESIN PLANARIZATION LAYER FOR LITHOGRAPHIC APPLICATIONS

This application is a continuation of application Ser. No. 07/787,460, filed Nov. 4, 1991, now abandoned.

BACKGROUND OF THE INVENTION

1. Field of the Invention

The present invention relates to an improved planarization coating layer comprising a selected novolak resin. The present invention also relates to a process of planarizing topographical features on a substrate. Furthermore, the present invention relates to a multilayer structure suitable for lithographic applications comprising a substrate having topographical features, a layer of selected planarizing coating material thereover which comprises a selected novolak resin, and an optional layer of photoresist material overlying the layer of planarizing material.

2. Brief Description of Prior Art

Multilayer resist imaging is becoming increasingly important for patterning submicron geometries in electronic devices. Using this technique in a bi-layer imaging system, the wafer topography, which may consist of epitaxial silicon islands, is covered by a layer of polymer to provide a relatively flat surface. This polymer layer is commonly called a planarization layer. A thin layer of photo or electron-beam resist is coated over this surface and patterned. Because the imaging overlayer is thin and flat, its pattern resolution is excellent and transferable to the wafer substrate by anisotropic plasma etching.

In a trilayer imaging system, a thin intermediate layer of oxygen-plasma resistant material, such as silicon oxide or nitride hardmask layer, is applied between the planarization layer and imaging resist layer. With such tri-layer systems, the upper resist layer is first exposed to radiation and then wet developed to create a pattern. During this operation, the intermediate silicon oxide or nitride hardmask layer and the lower planarization layers are unaffected. Next, the intermediate layer is dry patterned by conventional methods. Finally, the planarization sublayer is dry developed with an oxygen plasma by conventional methods.

Choosing the right material for a planarization layer is not an easy job. Planarization layers for submicron pattern imaging must have particularly flat upper surfaces to maintain precise line width control.

Generally, there are two types of planarization layers used today. One type is nonremovable material. This type is used principally as an insulating material. Polyimides and spin-on glass are typical material used for this type of planarization layer. The second type is removable and reflowable materials. Typical classes of this material include poly(methyl methacrylate) (PMMA),- novolaks, photoresist compositions, and polyesters. U.S. Pat. No. 4,621,042, which issued to Pampalone et al. on Nov. 4, 1986, teaches the use of Pure o-cresol novolak resin as a planarization layer. This patent is incorporated herein by reference in its entirety.

In early semiconductor multilayer lithographic processes, commercial photoresists made with a high percentage of novolak resins, particularly m-cresol novolaks were used as planarization processes. In 1986, T. R. Pampalone, J. J. DiPiazza, and D. P. Kanen (see "Novolak Resin Planarization Layers for Multilayer Resist Imaging Systems" *Journal of the Electrochemical Society*, Vol. 133, No. 11, November 1986, pages 2394–2398 and U.S. Pat. No. 4,621,042) suggested that photoresist compositions are a poor choice for a planarization layer material. Instead, they urged that novolak resins which can flow significantly before the onset of polymerization make the best planarization layers. This happens when the resin melts at low temperatures and polymerizes at high temperature (i.e., reacts slowly). They suggested that o-cresol novolak resins have this characteristic.

Pampalone et al. also stated that other important parameters to be considered in choosing a material for a planarization layer include its ability to accept the deposition of hardmask materials and imaging resist materials over it as well as its susceptibility to oxygen RIE plasmas.

While pure o-cresol novolak resins are suitable materials for some applications, they form unacceptable gels and pinholes when used as a reflowable planarization coating in some microlithographic processes. Also, low molecular forms of o-cresol novolak resins have unacceptable adhesion properties.

The present invention is directed toward an improved certain novolak planarization material which does not have the gel and pinhole problems which are associated with pure o-cresol novolak resin.

3. Citation of Possibly Relevant Art

The following U.S. patents and literature are cited to further illustrate some of the various materials which have been employed for planarization materials.

U.S. Pat. No. 4,362,809, which issued to Chen et al. on Dec. 7, 1982, teaches the use of a dried polymethylmethacrylate (PMMA) resin as a planarization layer.

U.S. Pat. No. 4,427,713, which issued to White et al. on Jan. 24, 1984, teaches a photoresist containing a novolak resin and a diazoquinone sensitizer as a planarization layer.

U.S. Pat. No. 4,515,828, which issued to Economy et al. on May 7, 1985, teaches that diacetylenic prepolymers, novolaks, and low molecular weight precursors of epoxies and polyimides may be used as planarization layers.

U.S. Pat. No. 4,532,005, which issued to Grieco et al. on Jul. 30, 1985, teaches that a novolak-type photoresist could be used as a bottom or planarization layer in a tri-layer resist system.

U.S. Pat. No. 4,612,210, which issued to Hofer et al. on Sep. 16, 1986, teaches the use of polyamide alkyl esters as a planarization layer.

U.S. Pat. No. 4,621,042, which issued to Pampalone et al. on Nov. 4, 1986, teaches the use of essentially pure o-cresol novolak resins as a planarization layer.

U.S. Pat. No. 4,642,162, which issued to Brownell et al. on Feb. 10, 1987, teaches the use of an organic material (e.g., positive photoresists and polyimides) as planarization layer materials.

U.S. Pat. No. 4,654,113, which issued to Tuchiya et al. on Mar. 31, 1987, teaches various organic and inorganic materials may be used as planarization layer. See col 2, lines 30–36.

U.S. Pat. No. 4,665,007, which issued to Cservak et al. on May 12, 1987, teaches that a positive diazo ketone novolak photoresist may be used as a planarization layer.

U.S. Patent Nos. 4,702,993 and 4,810,617, which issued to White et al. on Oct. 27, 1987 and Mar. 7, 1989, teach polyimides and certain positive resists are suitable as a planarization layer in multilayer electron beam resists.

U.S. Pat. No. 4,732,847, which issued to Radigan on Mar. 22, 1988, teaches resins such as photoresists, polyimides, polymethacrylates, and the like in a tri-level resist system.

U.S. Pat. No. 4,741,926, which issued to White et al. on May 3, 1988, teaches the use of PMMA and novolak resin/diazoquinone sensitizer photoresist composition as a planarization layer.

U.S. Pat. No. 4,745,045, which issued to Fredericks et al. on May 17, 1988, teaches that a mixture of a positive photoresist and polyamic acid (which converts to a polyimide) may be used as a planarization layer.

U.S. Pat. No. 4,803,147, which issued to Mueller et al. on Feb. 7, 1989, teaches that certain solvent-soluble polyimide polymers may be used as planarization layers.

U.S. Pat. No. 4,806,453, which issued to Vidusek et al. on Feb. 21, 1989, teaches that a positive polyglutarimide photoresist may be useful as a planarization layer.

D. V. Comello, "Planarizing Lead Edge Devices" *Semiconductor International* November, 1990, pages 60-62, 64, and 66 provide a synopsis of various planarization materials and techniques used today in the semiconductor industry.

Separately, the following U.S. Patents are cited because they teach certain phenolic novolak resin compositions and their use in photoresist formulations.

U.S. Pat. No. 4,123,279, which issued to Kobayashi on Oct. 31, 1978, teaches a photoresist formulation containing a Phenol-aldehyde novolak resist made by reacting a substituted phenol, preferably t-butylphenol, with an aldehyde under acid conditions.

U.S. Pat. No. 4,173,473, which issued to Fabrenholtz et al. on Nov. 6, 1979, teaches making a novolak resin by reacting a cresol, an aldehyde or reactive ketone, and an aromatic hydroxyl compound having an alkyl side chain of from 3-15 carbon atoms. The only specifically mentioned aromatic hydroxyl compound is 2-tertiary butyl phenol U.S. Pat. No. 4,308,368, which issued to Kubo et al. on Dec. 29, 1981, teaches novolak resins made by reacting a mixture of selected substituted phenols (e.g., t-butylphenol, n-butylphenol), phenol, and or cresol with an aldehyde.

BRIEF SUMMARY OF THE INVENTION

Accordingly, the present invention is directed to a planarization material comprising a novolak resin made by the condensation reaction of an aldehyde source with a phenolic monomeric source comprising at least 25 mole percent ortho-secondary butyl phenol in a suitable solvent.

Furthermore, the present invention is directed to a multilayer structure suitable for microlithography applications comprising a substrate having topographical features, a layer of planarizing material thereover, and an optional layer of photoresist material overlying the layer of planarizing material, wherein said planarizing layer comprises a novolak resin made by the condensation reaction of an aldehyde source with a phenolic monomeric source comprising at least 25 mole percent of orthosecondary butyl phenol.

Still further, the present invention is directed to a method of planarizing topographical features on a substrate for subsequent coating of a radiation-sensitive composition thereon comprising:

(1) applying thereover a coating of a planarizing material comprising a novolak resin made by the condensation reaction of an aldehyde source with a phenolic monomeric source comprising at least 25 mole percent of ortho-secondary butyl phenol in a suitable solvent; and (2) heating said coated substrate to remove essentially all of said solvent therefrom and cause said coating to reflow, thereby planarizing the topographical features.

DETAILED DESCRIPTION

The planarization material of the present invention is a novolak resin made by reacting an aldehyde source with ortho-secondary butyl phenol alone or in combination with other phenolic moieties under usual novolak-making conditions.

Any suitable aldehyde source may be used for this reaction. Examples of aldehyde sources include formaldehyde, acetoaldehyde, haloacetoaldehydes, benzoaldehydes, halobenzoaldehydes, and the like. The most preferred is formaldehyde.

Other phenolic moieties which may be mixed with ortho-secondary butyl phenol include phenol, cresols, xylenols, trimethylphenols, and the like. The most preferred is o-cresol.

Preferably, the ortho-secondary butyl phenol is at least about 35 mole percent of the total phenolics used in making said novolak resin. Most preferably, ortho-secondary butyl phenol is either the only phenolic employed in making the novolak resin or employed in combination with o-cresol novolak.

When ortho-secondary butyl phenol and o-cresol are used together, their preferred mole ratio is from about 35:65 to about 80:20, respectively.

It has been found that novolaks made from such mixtures of ortho-secondary butyl phenol and o-cresol do not shrink as much as planarization materials commercially available during the cross-linking step. Furthermore, they do not undercut as much during oxygen plasma treatment and do not reticulate, crack, or have localized wrinkling over metal steps. Still further they do not form "eyelashes" (hair-like protrusions) around bonding pads and do not exhibit a rise in the height of the coating near the edge of a N-layer plug (commonly known as "bat wings").

Generally, the novolak-forming reaction occurs in the presence of an acid catalyst. Suitable acid catalysts include those commonly employed in acid condensation-type reactions such as HCl, $H_3PO_4$, $H_2SO_4$, oxalic acid, maleic acid, maleic anhydride, and organic sulfonic acids (e.g., p-toluene sulfonic acid). Generally, it is also preferred to carry out the condensation reaction in the presence of an aqueous medium or an organic solvent. Suitable organic solvents include ethanol, tetrahydrofuron, cellosolve acetate, 1-methoxy-2-propanol, and 2-ethoxy ethanol. Preferred solvents are water-soluble solvents such as ethanol, 1-methoxy-2-propanol, and 2-ethoxy ethanol.

In making a preferred class of resins, the preferred precursors, namely phenolic monomers (most preferably, a mixture of ortho-secondary phenol and o-cresol in a 50:50% mole ratio) and formaldehyde are placed in a reaction vessel. The reaction mixture usually also contains an acid catalyst and solvent as noted above. The mixture is then preferably heated to a temperature in the range from about 60° C. to about 120° C., more preferably, from about 65° C. to about 95° C., for the novolak-forming condensation polymerization reaction to occur. If an aqueous medium is used instead of an organic solvent, the reaction temperature is usually maintained at reflex, e.g., about 90° to 100° C. The reaction time will depend on the specific reactants used and the ratio of formaldehyde to phenolic monomers. The mole ratio of formaldehyde to total phenolic moieties is preferably from about 0.5:1 to about 1.2:1, more preferably from about 0.7:1 to about 1:1. Reaction times from 3 to 20 hours are generally suitable.

These preferred resins of the present invention preferably have a molecular weight from about 500 to about 25,000, more preferably from about 750 to about 20,000. These preferred resins also have from about 35 to 100, more preferably 40 to 80, mole percent of ortho-secondary butyl phenol.

The planarization material of the present invention may be dissolved in a solvent or solvents to facilitate their application to the substrate. Examples of suitable solvents include methoxyacetone propane, ethyl cellosolve acetate, n-butyl acetate, xylene, ethyl lactate, propylene glycol alkyl ether acetate, diglyme, ethyl 3-ethoxy propionate, or mixtures thereof and the like. The preferred solvent is ethyl lactate.

The preferred amount of solvent may be from about 50% to about 500%, or higher, by weight, based on the total solids in the planarization material.

Conventional additives such as anti-striation agents, plasticizers, and the like may also be incorporated into the planarization material of the present invention.

Anti-striation or leveling agents level out planarization coating or film to a uniform thickness. In other words, the leveling agent is used to eliminate the formation of striations on the surface of the polymer coating once the coating is spun onto the substrate surface. Anti-striation agents may be used up to 5% weight levels, based on the weight of solids in the planarization material. One suitable class of anti-striation agents is nonionic silicon-modified polymers. A preferred one is TROYKYD 366 made by Troy Chemical Co., Newark, N.J. Another suitable class of anti-striation agents is fluoroaliphatic polymeric ester surfactants. A preferred one is FC-430 FLUORAD made by 3M of St. Paul, Minn. Nonionic surfactants may also be used for this purpose, including, for example, nonylphenoxy poly-(ethyleneoxy) ethanol; octylphenoxy (ethyleneoxy) ethanol; and dinonyl phenoxy poly(ethyleneoxy) ethanol.

Plasticizers improve the coating and adhesion properties of the planarization material and allows for the application of a thin coating or film of planarization material which is smooth and of uniform thickness onto the substrate. Plasticizers which may be used include, for example, phosphoric acid tri-(B)-chloroethyl)-ester; stearic acid; dicamphor; polypropylene, acetal resins; phenoxy resins; and alkyl resins up to 10% weight levels, based on the weight of solids in the planarization material.

The planarization material can be applied to a substrate having topographical surfaces by any conventional method used in this art including dipping, spraying, whirling, and spin coating. When spin coating, for example, the planarization material may be adjusted as to the percentage of solids content in order to provide a coating of the desired thickness given the type of spinning equipment and spin speed utilized and the amount of time allowed for the spinning process.

For purposes of this invention, any substrate which has topographical features on it and may be used for microlithographic applications.

Suitable substrates include silicon, aluminum, or polymeric resins, silicon dioxide, doped silicon dioxide, silicon resins, gallium arsenide, silicon nitride, tantalum, copper, polysilicon, ceramics, and aluminum/copper mixtures.

The planarization coatings produced by the above-described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the planarization material is coated onto the substrate, the coated substrate is soft-baked at approximately 70° to 125° C. until substantially all the solvent has evaporated and only a uniform planarization layer coating remains on the substrate.

After, or simultaneously, this solvent evaporation step, the planarization layer-coated substrate is subjected to hard or reflow bake so as to melt the novolak planarization material and cause it to flow.

Depending on thickness and coating and the time and temperature of the bake cycle, the polymer will achieve varying degrees of planarization. The optimum degree of planarization is achieved when the coated wafer is held for a long period of time at the temperature where the planarization coating or layer is at a minimum value and cross-linking of the polymer has not yet begun. For the Planarization material of the present invention, the optimum planarization temperature appears to be between about 170° C. and about 200° C.

If the substrate coated with the planarization layer is to be subjected to a subsequent plasma etch-back process, then it may be desirable to subject the coated substrate to another baking stage at a higher temperature before the plasma treatment so as to cross-link the novolak planarization coating and prevent the onset of reticulation during the plasma treatment. This baking stage is generally carried out at about 190° C. to about 210° C.

After the planarizing layer has been hard-baked a photoresist layer or a hardmask layer/photoresist layer structure may optionally be deposited thereover, suitably by conventional techniques such as spin-coating. When a hardmask layer is present, it is generally deposited by chemical vapor deposition. The photoresist may be either positive or negative and is suitably resistant to oxygen plasma. The final thickness of the photoresist layer is generally from about 0.5 to 2, suitably about 0.5 micrometer. Suitable commercial photoresists include diazoquinone/novolak resin type resists such as HP-204 of OCG Microelectronic Materials, Inc. of West Paterson, N.J., and the like.

The photoresist layer is irradiated through a suitable mask with UV light, typically in the range of 350 to 450 nm, utilizing conventional equipment, and then wet developed with the reagent recommended by the manufacturer. Wherein the subject compositions contain a photoinitiator, they are soft-baked, patterned, irradiated with deep UV light to prevent thermal flow, and then hard-baked as described above.

When utilized in a multilayer imaging system, the portion of the subject planarizing/absorptive layer exposed by development of the photoresist layer is suitably dry developed using an oxygen or $CHF_3$ plasma. The parameters of the oxygen plasma etch may vary within conventionally recognized ranges. Where a hardmask layer is present, it is also suitably removed in a plasma such as a conventional fluorocarbon etch. The subject planarizing/absorptive layers possess excellent image resolution down to the substrate with minimal loss of photoresist. When the subject absorptive layers are coated onto a transparent substrate for lithographic mask preparation, it is preferred that development of the entire structure be anisotropic using conventional plasma techniques.

The planarizing/absorptive layers of this invention provide excellent pattern resolution, particularly over substrate topography heretofore considered to be difficult to planarize.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

100% Ortho-Secondary Butyl Phenol-Formaldehyde Novolak

A planarization material was prepared by dissolving 35 grams of a novolak in 65 grams of ethyl lactate solvent and adding 0.03 grams of FC-430 surfactant as an anti-striation agent. The novolak was an ortho-secondary butyl phenol/formaldehyde novolak (Novolak HRJ-4069 available from Schenectady Chemicals Inc. of Schenectady, N.Y.). Its viscosity (ICI at 150° C.) was 9000 CPS.

This planarization material was coated onto silicon wafers having one micron high silicon oxide pads on their surface. These pads were 100 micron squares separated by 100 microns from adjacent pads. The planarization material was spin coated onto the padded surface of the wafers in about a 2 micron thickness above the silicon surface (1 micron above the pads) using an SVG track system which included a hot plate. The spin-coating operation involved:

(1) increasing the acceleration of the coater for 7 seconds at 6000 rpm/sec;

(2) spreading the planarization material for 6 seconds at 400 rpm with the acceleration at 6000 rpm/second; and (3) spinning for 30 seconds at 2000 rpm with 6000 rpm/sec acceleration.

After this spin-coating operation, the coated wafers were soft-baked on the hot plate for 50 seconds at 105° C.

After this soft-bake operation, the wafers were subjected to a reflow heating step at 170° C. for 50 seconds.

The coated wafers were inspected to determine percent planarization and average pinhole count in the planarization material.

The percent planarization was determined by measuring the film thickness of the reflowed planarization material and then calculating the percent planarization by the equation:

$$\% \text{ Planarization} = 100 \times \frac{H_1 - H_2}{H_1}$$

wherein $H^1$ is the 1 micron height of the pads and $H_2$ is the average difference in reflowed film thicknesses as measured over the pads and between the pads. As $H_2$ approaches zero, the percent planarization becomes 100%. The closer the value of percent planarization is to 100%, the better the planarization is.

The average pinhole count is measured by visually counting the pinholes on each wafer and averaging that count.

The results of these measurements are given in Table 1.

EXAMPLE 2

50% O-Cresol/50% Ortho-Secondary Butyl Phenol-Formaldehyde Novolak

The procedure of Example 1 was repeated except that the phenolic-formaldehyde novolak employed was made from a phenolic mixture of 50 mole percent o-cresol and 50 mole percent ortho-secondary butylphenol. This novolak was Novolak HRJ-11392 available form Schenectady Chemicals Inc. of Schenectady, N.Y. Its viscosity (ICI at 150° C.) was 1900 CPS.

The results of the percent planarization and average pinhole count measurement are shown in Table 1.

COMPARISON EXAMPLE 1

O-Cresol/Formaldehyde Novolak

The procedure of Example 1 was repeated except that the phenolic-formaldehyde novolak employed was made from a phenolic which was 100 mole percent o-cresol. This o-cresol-formaldehyde novolak was Novolak HRJ-2163 available from Schenectady Chemicals, Inc. of Schenectady, N.Y. Its viscosity (ICI at 150° C.) was 2200 CPS. Its $M_N$ was 649 and its $M_W$ was 1274.

The results of the percent planarization and average pinhole count measurements are shown in Table 1.

COMPARISON EXAMPLE 2

Tertiary-Butyl Phenol Novolak

The procedure of Example 1 was repeated except that the phenolic-formaldehyde novolak employed was made from a phenolic which was 100 mole percent tertiary-butyl phenol. This novolak is Novolak SD-392A available from Borden Chemicals, Inc. of Louisville, Ky. This product had a $M_N$ of 468 and a $M_W$ of 697.

The results of the percent planarization and average pinhole count measurement are shown in Table 1.

TABLE 1

| Ex. or Com. | Type of Novolak | % Planarization | Pinhole Count/4" Wafer |
|---|---|---|---|
| E-1 | O-sec butyl phenol | 86.8 | 0 |
| E-1 | O-cresol/O-sec butyl phenol | 89.1 | 0 |
| C-1 | O-cresol | 90.8 | 36 |
| C-2 | O-t-butyl phenol | 86.2 | 0 |

Although o-cresol novolak/ethyl lactate solution demonstrates good planarization properties, the quality of the coating is such that this type of novolak cannot be used commercially as a planarizing layer.

The o-t-butyl phenol novolak in ethyl lactate solvent displayed good coating qualities as well as good planarization properties, however, because a precipitate formed upon storage, this polymer was not satisfactory for many commercial uses.

The copolymer solution of o-cresol/o-sec butyl phenol novolak in ethyl lactate solvent, however, does show improved coating properties and can be used commercially as a planarization coating because of these enhanced coating properties.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A planarization coating layer comprising a planarization layer of novolak resin made by the condensation reaction of an aldehyde source with a phenolic monomeric source comprising at least 25 mole percent ortho-secondary butyl phenol.

2. The planarization coating layer of claim 1 wherein said novolak resin is made by a condensation reaction of an aldehyde source with a phenolic monomeric source comprising at least 35 mole percent ortho-secondary butyl phenol.

3. The planarization coating layer of claim 1 wherein said novolak resin is made by a condensation reaction of an aldehyde source with a phenolic monomeric source consisting essentially of 100 mole percent ortho-secondary butyl phenol.

4. The planarization coating layer of claim 1 wherein said aldehyde source is selected from the group consisting of formaldehyde, acetoaldehyde, haloacetoaldehydes, benzoaldehydes, and halobenzoaldehydes.

5. The planarization coating layer of claim 4 wherein said aldehyde source is formaldehyde.

6. The planarization coating layer of claim 4 wherein the molar ratio of aldehyde source to phenolic monomeric source is from about 0.5:1 to about 1.2:1.

7. The planarization coating layer of claim 1 wherein said phenolic monomeric source comprises a mixture of ortho-secondary butyl phenol and o-cresol in a mole ratio from about 35:65 to about 80:20.

8. A multi-layer structure suitable for microlithographic applications comprising a substrate having topographical features, a layer of planarizing material thereover, an optional layer of photoresist material overlying the layer of planarizing material, wherein said planarizing layer comprises a novolak resin made by the condensation reaction of an aldehyde source with a phenolic monomeric source comprising at least about 25 mole percent of ortho-secondary butyl phenol.

9. The multi-layer structure of claim 8 wherein said novolak resin is made by a condensation reaction of an aldehyde source with a phenolic monomeric source comprising at least 35 mole percent ortho-secondary butyl phenol.

10. The multi-layer structure of claim 8 wherein said novolak resin is made by a condensation reaction of an aldehyde source with a phenolic monomeric source consisting essentially of 100 mole percent ortho-secondary butyl phenol.

11. The multi-layer structure of claim 8 wherein the molar ratio of aldehyde source to phenolic monomeric source is from about 0.5:1 to about 1.2:1.

12. The multi-layer structure of claim 8 wherein said novolak resin is made by a condensation reaction of an aldehyde source with a phenolic monomeric source consisting essentially of 100 mole percent ortho-secondary butyl phenol.

13. A method of planarizing topographical features on a substrate for subsequent coating of a radiation sensitive composition thereon comprising:
   (1) applying thereover a coating of a planarizing material comprising a novolak resin made by the condensation reaction of an aldehyde source with a phenolic monomeric source comprising at least 25 mole percent of ortho-secondary butyl phenol and a suitable solvent; and
   (2) heating said coated substrate to remove essentially all of said solvent therefrom and cause said coating to reflow, thereby planarizing the topographical features.

14. The method of claim 13 wherein said novolak resin is made by a condensation reaction of an aldehyde source with a phenolic monomeric source comprising at least 35 mole percent ortho-secondary butyl phenol.

15. The method of claim 13 wherein said novolak resin is made by a condensation reaction of an aldehyde source with a phenolic monomeric source consisting essentially of 100 mole percent ortho-secondary butyl phenol.

16. The method of claim 13 wherein the molar ratio of aldehyde source to phenolic monomeric source is from about 0.5:1 to about 1.2:1.

17. The method of claim 13 wherein said phenolic monomeric source comprises a mixture of ortho-secondary butyl phenol and o-cresol in a mole ratio from about 35:65 to about 80:20.

* * * * *